United States Patent [19]
Hamamoto et al.

[11] Patent Number: 5,388,066
[45] Date of Patent: Feb. 7, 1995

[54] CONTENT ADDRESSABLE MEMORY DEVICE AND A METHOD OF DISABLING A COINCIDENCE WORD THEREOF

[75] Inventors: Takeshi Hamamoto; Tadato Yamagata; Masaaki Mihara, all of Hyogo, Japan

[73] Assignee: Mitsubishi Denki Kabushiki Kaisha, Tokyo, Japan

[21] Appl. No.: 84,098

[22] Filed: Jul. 1, 1993

[30] Foreign Application Priority Data

Jul. 6, 1992 [JP] Japan .................................. 4-178398
May 20, 1993 [JP] Japan .................................. 5-118209

[51] Int. Cl.⁶ ............................................ G11C 15/00
[52] U.S. Cl. ................................. 365/49; 365/189.07; 364/DIG. 2; 364/956
[58] Field of Search .......................... 365/49, 189.07; 364/956, 956.1

[56] References Cited

U.S. PATENT DOCUMENTS

| | | | |
|---|---|---|---|
| 4,831,586 | 5/1989 | Nakagawa et al. | 365/49 |
| 4,975,873 | 12/1990 | Nakabayashi et al. | 365/49 |
| 4,991,136 | 2/1991 | Mihara | 365/49 |
| 4,996,666 | 2/1991 | Duluk, Jr. | 365/49 |
| 5,031,141 | 7/1991 | Guddat et al. | 365/49 |
| 5,036,486 | 7/1991 | Noguchi et al. | 365/189.07 |
| 5,173,872 | 12/1992 | Crawford et al. | 365/49 |
| 5,220,526 | 6/1993 | Giles et al. | 365/49 |
| 5,226,009 | 7/1993 | Arimoto | 365/49 |
| 5,257,220 | 10/1993 | Shin et al. | 365/189.07 |

FOREIGN PATENT DOCUMENTS 1-223697 6/1989 Japan .

OTHER PUBLICATIONS

"Low-Cost Associative Memory", J. Mundy et al., IEEE International Solid-State Circuit Conference, Oct. 1972.

"A 20-KBIT Associative Memory LSI for Artificial Intelligence Machines", T. Ogura et al., IEEE Journal of Solid-State Circuits, vol. 24, No. 4, Aug. 1989.

Primary Examiner—Joseph A. Popek
Assistant Examiner—Tan Nguyen
Attorney, Agent, or Firm—Lowe, Price, LeBlanc & Becker

[57] ABSTRACT

A data storing circuit including memory cells arranged in a plurality of rows and columns and flag cells corresponding to respective rows for storing flag information, the memory cells and the flag cell of the same row constituting one word, is provided. When a retrieval data is externally applied, the data included in the retrieval data is compared with the data of the memory cell, and the flag information stored in the retrieval data is compared with the flag stored in the flag cell. Respective results of comparison are output to a match line. Logical operation circuit carries out logical operation dependent on the result of comparison output to the match line, and writes the logical output to the flag cell of the data storing circuit.

13 Claims, 18 Drawing Sheets

FIG.2
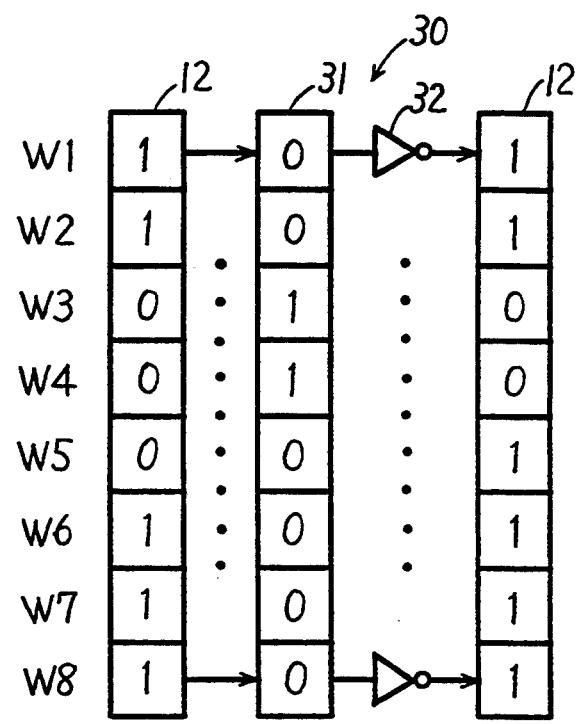
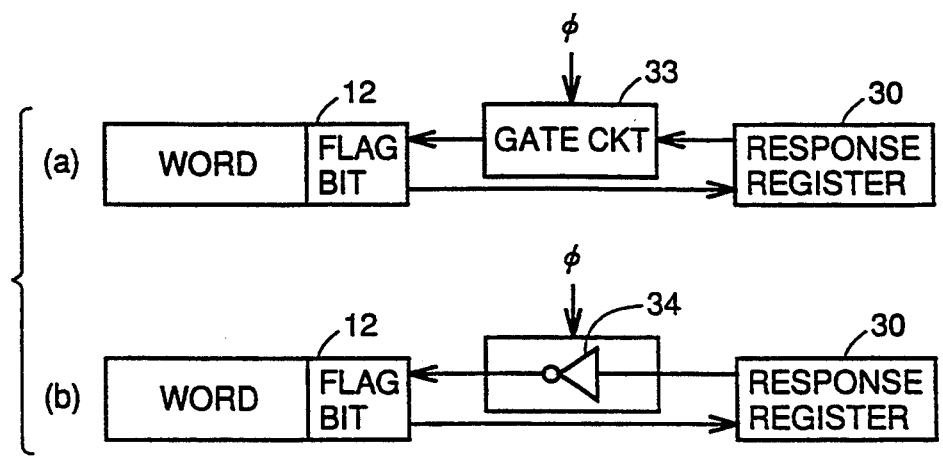
FIG.3

CONTENT ADDRESSABLE MEMORY DEVICE AND A METHOD OF DISABLING A COINCIDENCE WORD THEREOF

BACKGROUND OF THE INVENTION

1. Field of the Invention

The present invention relates to a content addressable memory device and a method of disabling a coincidence word. More particularly, the present invention relates to a content addressable memory (CAM) conducting a retrieval operation on the basis of an applied retrieval data and designation of a particular word, and to a method of disabling a coincidence word thereof.

2. Description of the Background Art

FIG. 21 is a block diagram showing a whole structure of a cache system employing a conventional CAM. In FIG. 21, a main memory 101 and a cache memory 103 are connected to a CPU 106 through a data bus 104 and an address bus 105. A dynamic RAM or a magnetic disk device is used as main memory 101. The magnetic disk device has relatively slow access time but has large storage capacity, and it is inexpensive. A CAM is used as cache memory 103. Though the storage capacity of CAM is small, it allows speedy access. Cache memory 103 is used to reduce access time of the main memory 101. Among the data stored in main memory 101, data which are frequently accessed are stored together with their addresses, in the cache memory 103. Writing and comparing operation in cache memory 103 is carried out under the control of a memory controller 102.

In the cache system structured as described above, cache memory 103 is accessed prior to the access to main memory 101 by CPU 106. More specifically, when an address signal is output from CPU 106 to address bus 105, cache memory 103 is controlled by a memory controller 102, and whether or not the address corresponding to the address signal is stored in cache memory 103 is determined. When the corresponding address has been stored in cache memory 103, a hit signal is provided from cache memory 103 and applied to memory controller 102. When the hit signal is applied from memory controller 102 to CPU 106, data in that region which corresponds to the region storing the address in cache memory 103 is read. When there is no address corresponding to the address signal output from the CPU 106 stored in cache memory 103, the hit signal is not applied and the main memory 101 is accessed.

The above described cache memory 103 includes a plurality of content addressable memory cells (hereinafter referred to as CAM cells). The CAM cell has, in addition to the normal writing and reading functions, a coincidence retrieval function in which data stored in the memory cell is compared with a retrieval data applied externally and whether or not they match with each other is detected.

Different from the normal memory, the basic function of a CAM is to enter a reference data and output an address of the word where the data matches with the reference data is stored. Generally, in a retrieval operation of the CAM, not all of the words in the memory array participate in the coincidence retrieving operation. Namely, there are unnecessary words which are not subjected to retrieval in the memory array of the CAM. Management of such unnecessary words is referred to as a garbage collection.

Conventionally, a flag bit has been provided corresponding to each word for performing the garbage collection. More specifically, when the flag bit is "0", the corresponding word participates in the coincidence retrieval, and when the flag is "1", the corresponding word does not participate in the coincidence retrieval. A register used only as the flag bit may be provided corresponding to each word, as a flag bit. However, in order to simplify the structure of the CAM, method employing CAM cells constituting a memory array as flag bits have been also proposed. The following prior art example of interest is one of such methods.

FIG. 22 is a block diagram showing an example of a CAM disclosed in Japanese Patent Laying-Open No. 1-223697 (U.S. Pat. No. 4,975,873). Referring to FIG. 22, the CAM includes a memory cell array 2, a read/write control portion 1, a flag bit column 12 and a flag bit control portion 11. Memory cell array 2 carries out reading and writing of data. Read/write control portion 1 inputs/outputs data and retrieval data to and from memory cell array 2 through bit line pairs B0 to Bn−1 with the timing controlled. Flag bit column 12 is coupled to memory cell array 2 and stores flag signals indicating the state of writing of each word. Flag bit control portion 11 is coupled to read/write control portion 1 and inputs/outputs to and from the flag bit column 12, flag signals of which timings are controlled through a bit line pair Bn.

The CAM further includes a response register 3, a multi-selection separating circuit 4, a word control circuit 6 and a control circuit 5. Response register 3 temporarily holds a result of retrieval output from flag bit column 12 and memory cell array 2. Multi-selection separating circuit 4 selects, when a plurality of results of retrieval are obtained, one of these results in accordance with a predetermined logic and outputs a match address MA thereof. Word control circuit 6 receives an external address EA, the match address MA and a control signal $\phi 5$ from control circuit 5, and drives and controls word lines W0 to Wm−1 and match lines M0 to Mm−1. Control circuit 5 provides timing control signals $\phi 1$ to $\phi 5$.

In the CAM shown in FIG. 22, when flag bit control portion 11 and read/write control portion 1 are set in accordance with control signal $\phi 1$ and external data D0 to Dn, reading, writing and coincidence retrieval operations in both the flag bit column 12 and the memory cell array 2 can be simultaneously carried out by a control signal $\phi 2$, without any specific complicated control. These operations will be described in the following.

In the coincidence retrieval operation, a retrieval data is set in flag bit control portion 11 and in read/write control portion 1 in a retrieval mode; a control signal $\phi 5$ is applied to word control circuit 6 to set match lines M0 to Mm−1 at set potentials; the retrieval data is applied to memory cell array 2 and the flag bit column 12; then results of retrieval provided to match lines M0 to Mm−1 are latched in response register 3 and input to the multi-selection separating circuit 4, so that the results are output as match addresses MA, and thus the operation is completed. A restricting retrieval (mask retrieval) is available by masking the retrieval data.

In writing operation, a write data is set in flag bit control portion 11 and read/write control portion 1 in a write mode; the write data is applied to memory cell array 2 and flag bit column 12; a word to be written is selected by applying the control signal $\phi 5$ and the external address EA of word control circuit 6; and the write data is written to the word, thus completing the operation. Partial writing (mask writing) is also possible by masking the write data.

In reading operation, a word from which reading is to be done is selected by inputting the control signal $\phi 5$ and the external address EA to word line control circuit 6 in a read mode, and read data from the selected word is taken in flag bit control portion 11 and read/write control portion 1.

The retrieval of unnecessary words (garbage collection) is effected by masking the memory cell array 2 by using mask data in the retrieval mode, and mask retrieval is effected only to flag bit column 12. The results of retrieval output to match lines M0 to Mm−1 are input to response register 3 and multi-selection separating circuit 4. Multi-selection separating circuit 4 outputs match address MA indicating the unnecessary word, the match address MA is input to word control circuit 6, and thus the operation is completed. More specifically, by the provision of the flag bit column 12, garbage collection is implemented in a simple manner. One of the unnecessary words may be activated by inputting the match address to word control circuit 6, so that data can be newly written to the unnecessary word in the subsequent write mode.

FIG. 23 is a schematic diagram showing an example of the flag bit column and the memory cell array shown in FIG. 22. Referring to FIG. 23, flag bit column 12 includes flag cells Cn, 0 to Cn, m−1 respectively connected to bit lines bn and/bn, word lines W0 to Wm−1 and match lines M0 to Mm−1.

Memory cell array 2 includes CAM cells C0, 0 to Cm−1, n−1 respectively connected to bit lines b0 and/b0 to bn−1 and/bn−1, word lines W0 to Wm−1 and match lines M0 to Mm−1.

As is apparent from FIG. 23, the flag cell used in flag bit column 12 and the CAM cell used in memory cell array 2 have identical structure. Further, word lines W0 to Wm−1 and match lines M0 to Mm−1 are used commonly in the flag bit column 12 and memory cell array 2. Therefore, special control signal for the flag bit column 12 is not necessary.

As described above, in the prior art example, garbage collection can be implemented without adding any complicated control means, since CAM cells are commonly used in flag bit column 12 and memory cell array 2.

FIG. 24 shows a principle of data retrieval in the CAM shown in FIG. 22. Referring to FIG. 24, when coincidence retrieval data "1011xxx" (xxx denote Don't Care: bits which are not the object of retrieval) is input from read/write control portion 1, CAM 2 retrieves data which coincides with the higher 4 bits "1011" of the coincidence retrieval data, determines whether or not the data of the third word W3, the sixth word W6 and the tenth word W10 coincide, and transfer "1" to the corresponding word in response register 3. Multi-selection separating circuit 4 contains a priority encoder 41 and a register 42. Priority encoder 41 has priorities of respective rows set therein. When three pieces of data coincide with the coincidence retrieval data as described above, "1" is set at a bit of a register 42 corresponding to that word which has the highest priority.

FIG. 25 (a) shows the concept of comparison between the data including a flag bit and the coincidence retrieval data including a flag bit. In the example shown in FIG. 25 (a), "0" in the coincidence retrieval data "abc0" indicates the flag bit. Among the data stored in CAM2, data which has "1" as the flag bit does not participate in retrieval and only that data of which flag bit is "0" participates the retrieval. In this example, the data of the second word W2 coincides with the coincidence retrieval data, and therefore "1" is set in response register 3 corresponding to the data of the second word W2. When there are plural data which coincide, "1" is set in response register 3 corresponding to the data having the highest priority, in the same manner as described with reference to FIG. 24.

FIG. 25 (b) shows the concept of mask retrieval. Among the coincidence retrieval data, word data are masked, and masked word data are all regarded as coincident. Therefore, retrieval is carried out only by the flag bit. The coincidence retrieval data with the flag bit only is successively compared with the flag bit of the CAM memory cell array 2, and "1" is set at the corresponding word of the response register 3 of which flag bit coincides.

There may be the case where an operation of disabling all of the plurality of coincident words is necessary. More specifically, in coincidence retrieval, when coincidence of one word is retrieved, retrieval may no longer be required. In that case, the plurality of coincident words must be disabled. To carry out this operation in the CAM shown in FIG. 22, the content of response register 3 is input to multi-selection separating circuit 4, one of the addresses of the coincidence word is input to word control circuit 6 and the word is activated. Then, by the control of flag bit control portion 11, the flag bit of that word is changed from "0" to "1". Then, the value of response register 3 corresponding to that word is rewritten from "1" (coincidence) to "0" (non-coincidence). By the above described operation, disabling of one word among a plurality of words is completed. Therefore, in order to disable a plurality of coincident words, the above described operation of coincidence must be repeated for the number of times corresponding to the number of coincident words.

On the contrary, there may be a case where an operation of disabling all the non-coincident words is necessary. In that case also, the operation similar to that of disabling all coincident words described above must be repeated.

Since the number of words is large in a CAM having large storage capacity, there may be a large number of words which are coincident. Therefore, much time is consumed to operate all the coincident words in accordance with the above described manner.

SUMMARY OF THE INVENTION

Therefore, an object of the present invention is to provide a content addressable memory device allowing simultaneous disabling of words which are non-coincident or coincident in parallel and at one time without adding any complicated control means, and to provide a method of disabling coincident words.

Briefly stated, in the present invention, data stored in memory cells of a plurality of rows and columns are compared with an applied retrieval data, and in response to the output of comparison, contents of specific memory cells of each row of the data storing circuit are re-written in parallel.

Therefore, in accordance with the present invention, contents of specific memory cells of each row can be re-written collectively, and words indicative of non-coincidence or coincidence can be disabled at one time.

According to another aspect of the invention, data are stored in a plurality of rows of a data storing circuit, and a flag information storing circuit for storing flag information is provided corresponding to each row of the data storing circuit. An externally applied flag information is compared with the flag information stored in the flag information storing circuit, coincidence therebetween is determined, and dependent on the result of comparison, the flag information is re-written in parallel.

More specifically, the flag information storing circuit stores the flag bit in advance only for the rows which are subjected to retrieval. The flag information storing circuit compares an externally applied flag information with the flag bit stored in the flag information storing circuit, while re-writing circuit re-writes the flag bit of the flag information storing circuit of the row coincidence/non-coincidence of which has been determined.

In accordance with a further aspect, the present invention includes memory cells arranged in a plurality of rows and columns and flag cells corresponding to respective rows for storing flag information. A data storing circuit constituting one word is provided by the memory cells and the flag cell of the same row, an externally applied retrieval data is compared with the data in the memory cells, the flag information of the retrieved data is compared with the flag of the flag cell, and respective results of comparison are output to match lines. Dependent on the result of comparison output to the match line, a logic operation circuit carries out a logic operation, and writes the logical output to the flag cell of the data storing circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows an operation of the embodiment shown in FIG. 1.

FIG. 3 shows another embodiment of FIG. 2 in which

FIG. 3 (a) shows an example employing a gate circuit and

FIG. 3 (b) shows an example employing an inverter.

DESCRIPTION OF THE PREFERRED EMBODIMENTS

Figure 1:
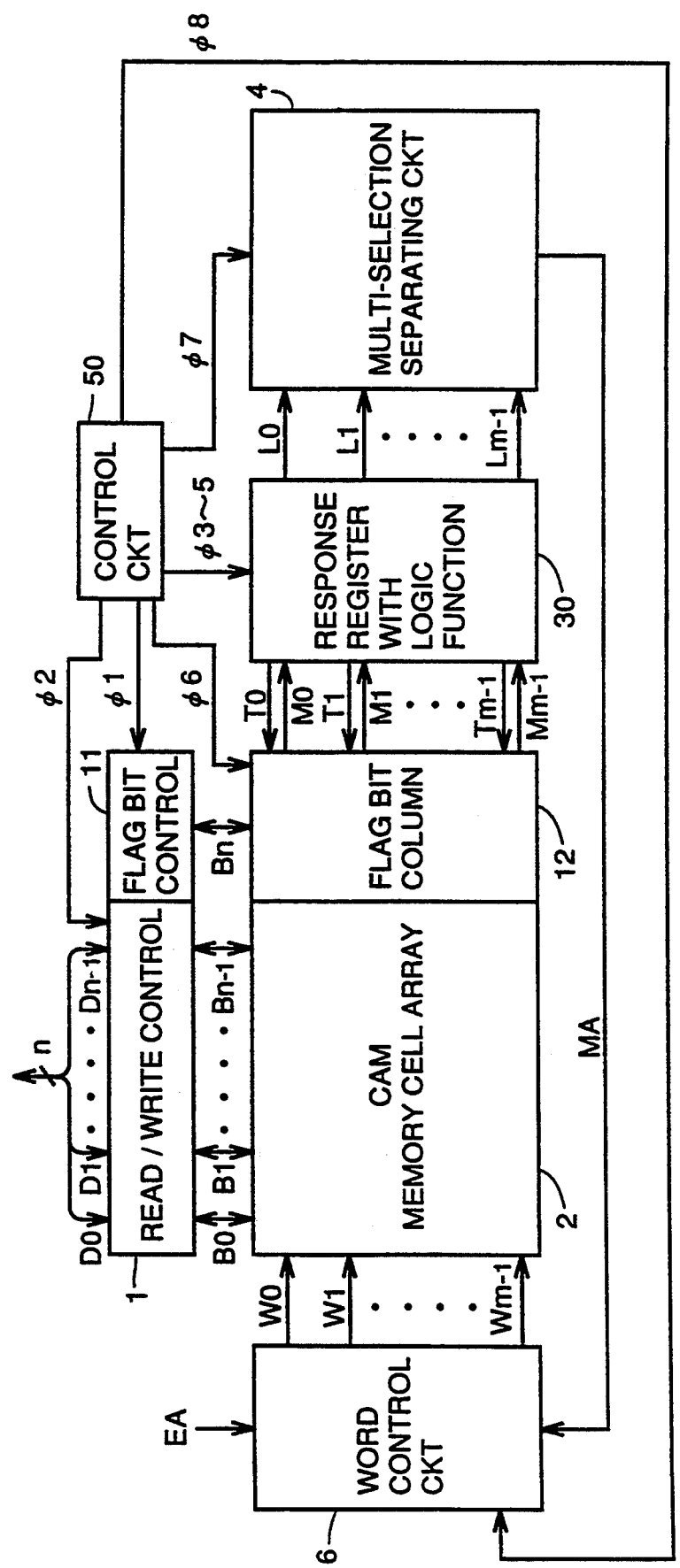
FIG. 1 is a block diagram showing a CAM in accordance with one embodiment of the present invention.
Figure 22:
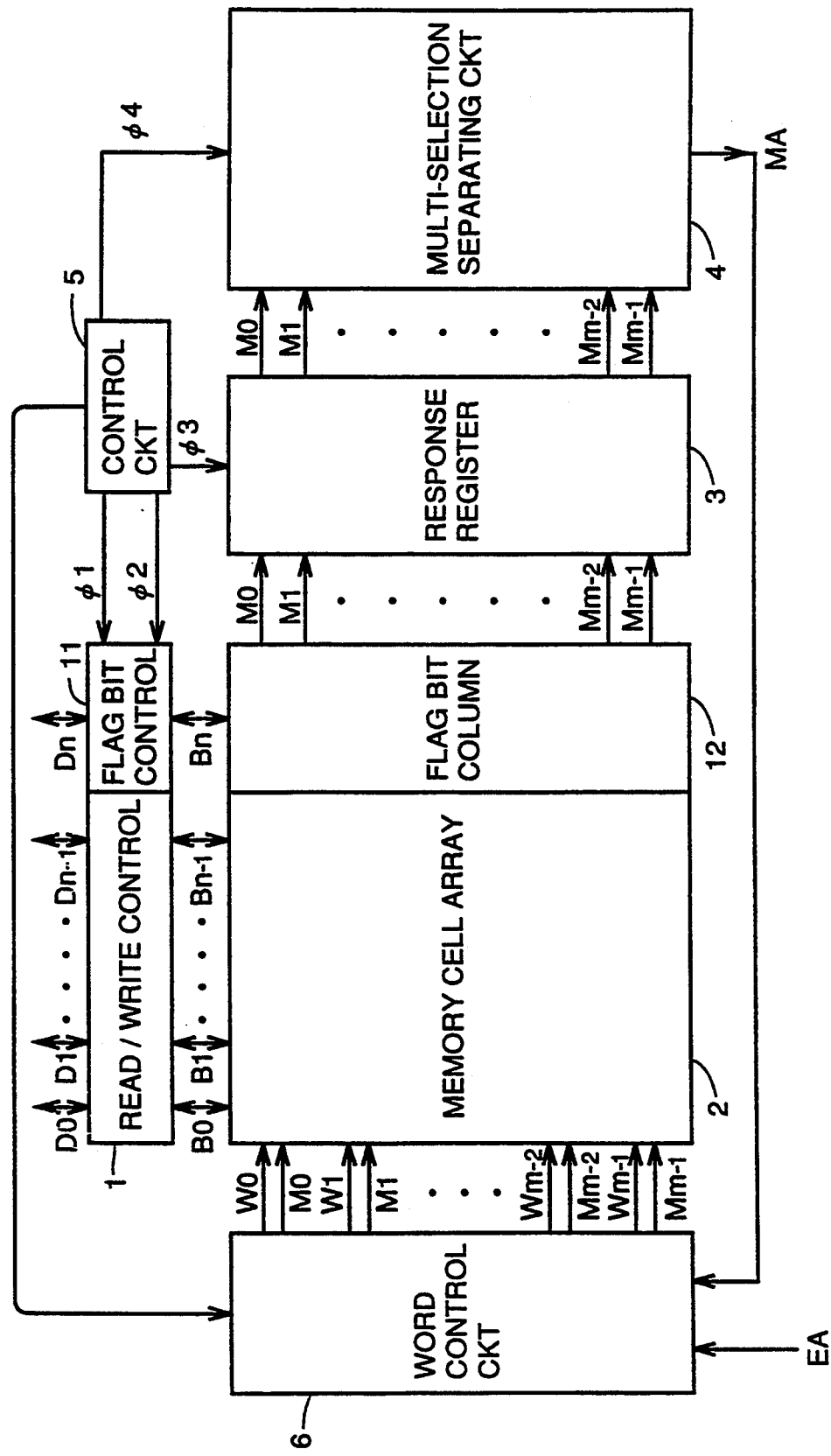
FIG. 22 is a block diagram showing a conventional CAM.
Figure 23:
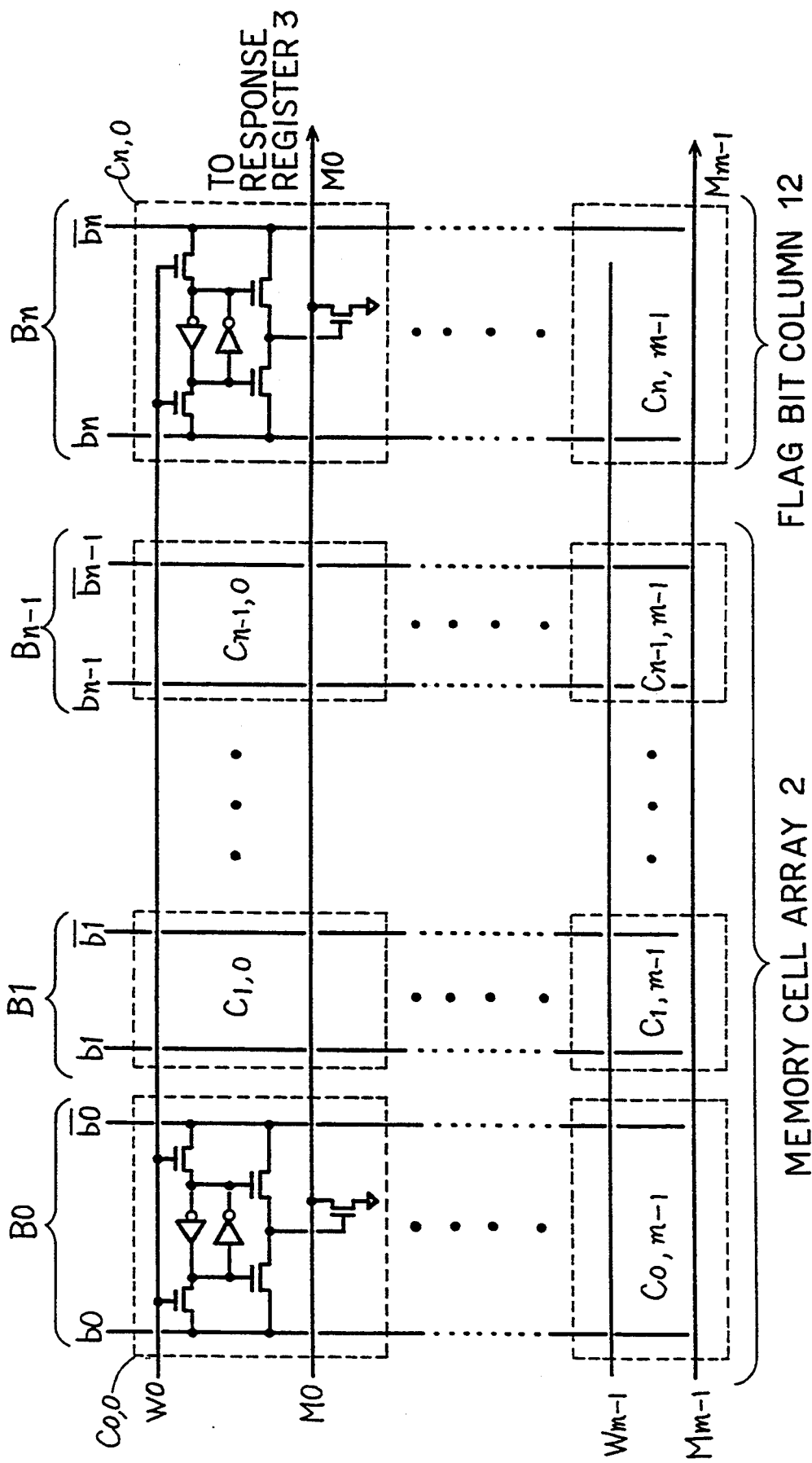
FIG. 23 is a schematic diagram showing the CAM cell array and the flag bit column in the conventional CAM.
Figure 24:
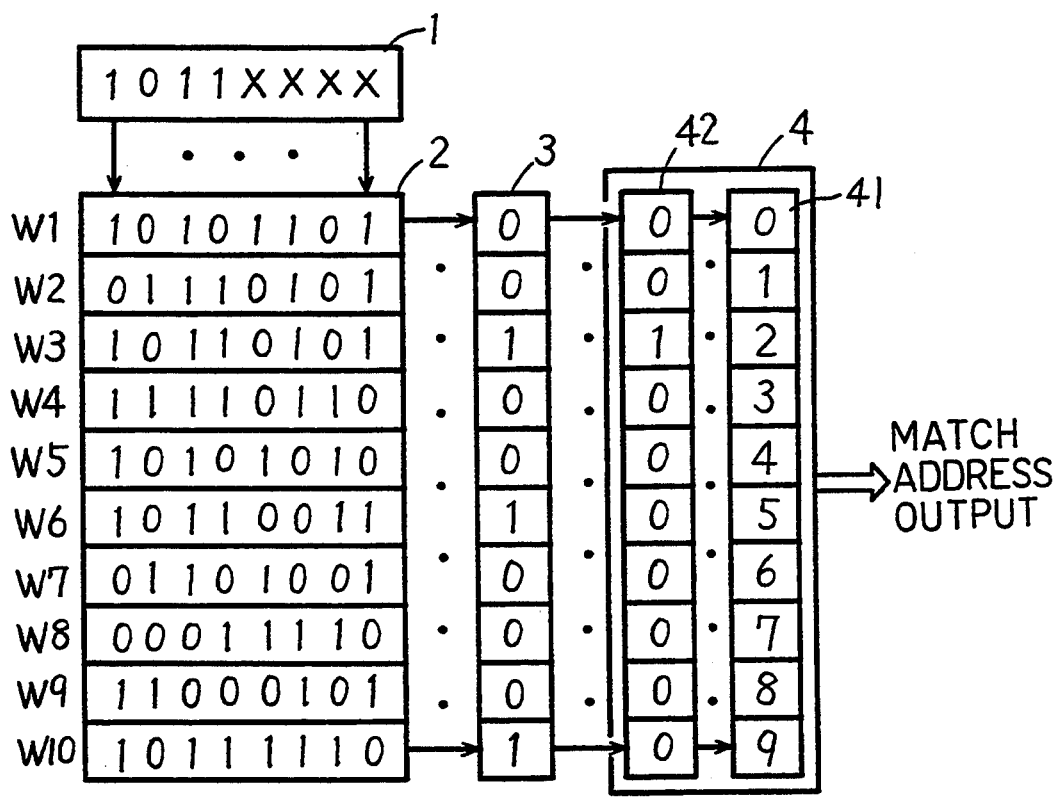
FIG. 24 shows a concept of data retrieval in the CAM shown in FIG. 22.
Figure 25:
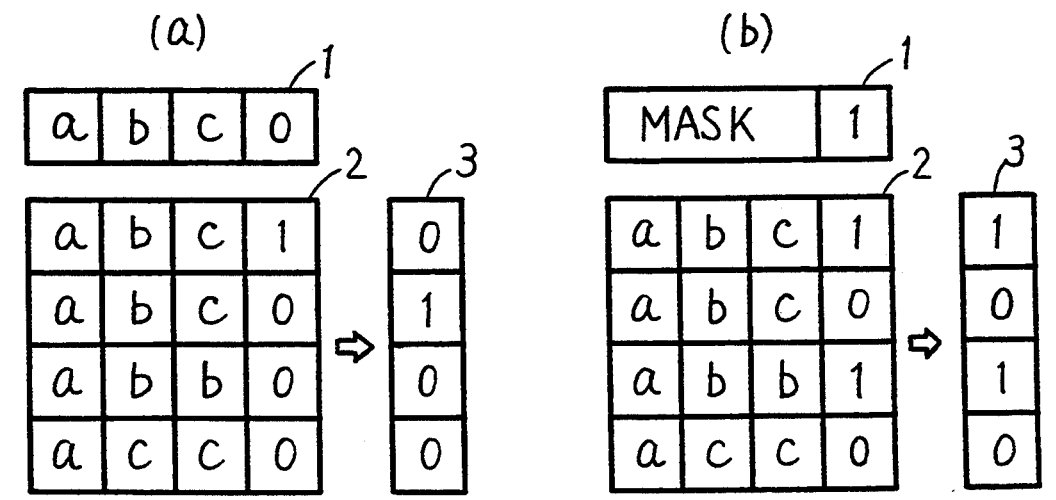
FIG. 25 shows the retrieval operation in the conventional CAM in which FIG. 25 (a) shows the concept of determining coincidence between coincidence retrieval data and data including a flag bit, and FIG. 25 (b) shows an example of mask retrieval.

FIG. 1 is a schematic block diagram of one embodiment of the present invention. The structure of FIG. 1 is similar to that of FIG. 22 described above except the following points. Namely, in place of response register 3 shown in FIG. 22, a response register 30 having logic function is provided, and in place of control circuit 5, a control circuit 50 is provided. Response register 30 having logic function holds results of retrieval output from flag bit column 12 and memory cell array 2 to match lines M0 to Mm−1, and transfers the contents thereof to the flag bit column 12 through transfer line pairs T0 to Tm−1. Control circuit 50 outputs timing control signals $\phi1$ to $\phi8$. Timing control signal $\phi1$ is applied to a flag bit control portion 11, timing control signal $\phi2$ is applied to read/write control portion 1, timing control signals $\phi3$ to $\phi5$ are applied to response register 30 having logic function, timing control signal $\phi6$ is applied to flag bit column 12, timing control signal $\phi7$ is applied to multi-selection separating circuit 4, and timing control signal $\phi8$ is applied to word control circuit 6.

FIG. 2 shows the operation of one embodiment of the present invention. The operation of disabling coincident words in the CAM will be described with reference to FIGS. 1 and 2. The operations of coincidence retrieval, reading, writing and garbage collection are the same as those of the prior art example described above.

Disabling of coincident words (turning to garbage) is carried out in the following manner. First, in the retrieval mode, retrieval operation is effected on memory cell array 2. At this time, retrieval data are set in the third word W3, the fourth word W4 and the fifth word W5 of memory cell array 2, and "1" is set at corresponding words in which data to be retrieved has been set in the flag bit column 12, as shown in FIG. 2. When the retrieval data coincides with the data of words W3 and W4, the results of retrieval are transferred and held in register 31 of response register 30 having logic function. More specifically "1" is held corresponding to the coincident words W3 and W4 in register 31. Thereafter, the results of retrieval held in register 31 are inverted word by word by an inverter 32 serving as the logic function, and again transferred to the flag bit column 12. Consequently, only the words which were unnecessary are extracted and held in the flag bit column 12. Therefore, in the flag bit column 12, "1" are set corresponding to the words which are to be newly disabled in addition to the words which have been unnecessary. By such an operation, disabling of a plurality of coincident words can be effected in parallel.

FIGS. 3 (a) and 3 (b) shows another embodiment of FIG. 2, showing only one word. In the example of FIG. 3 (a), the results of retrieval stored in response register 30 are stored as they are in flag bit column 12 by opening a gate circuit 33 in response to a control signal $\phi$. In the example of FIG. 3 (b), the result of retrieval is inverted by an inverter 34 operating in response to the control signal $\phi$ instead of the gate circuit 33 and the output therefrom is transferred to flag bit column 12.

Figure 4:
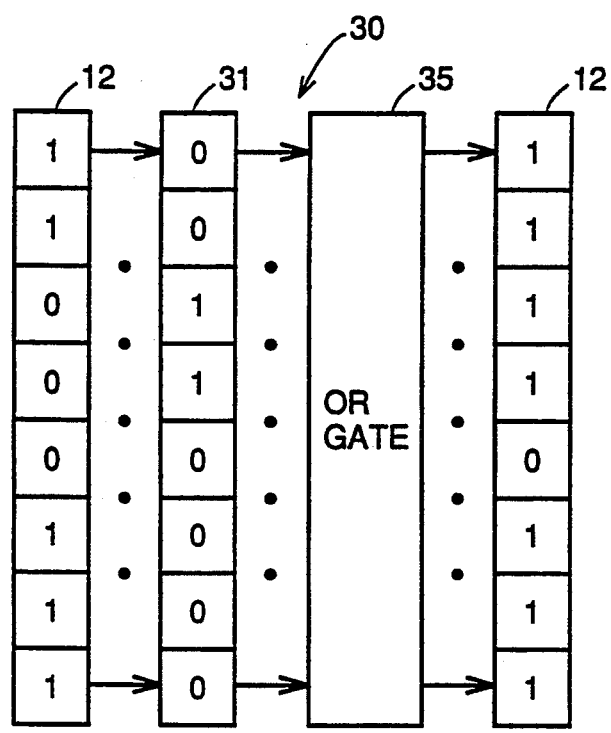
FIG. 4 shows an embodiment in which all words showing coincidence are disabled by using a response register having logic function.

FIG. 4 shows an embodiment in which coincident words are all disabled by using a response register having logic function. In the embodiment shown in FIG. 4, an OR gate 35 is provided in place of the inverter 32 shown in FIG. 2. In order to disable all the coincident words, "1" is newly transferred in parallel to flag bit column 12, including the results of retrieval with "1" set in the register 31 of response register 30 as well as the words having "1" set in the flag bit column 12. For this purpose, OR gate 35 provides a logical sum of each word of flag bit column 12 and each word of register 31, and transfers the results in parallel to flag bit column 12.

FIGS. 5 to 8 show specific examples of OR gate 35 shown in FIG. 4.

Figure 5:
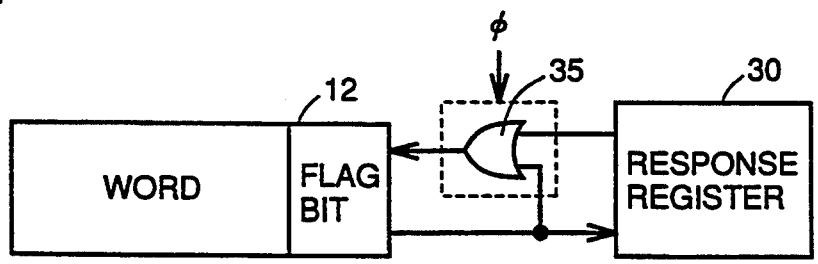
FIG. 5 shows a specific example of the OR gate shown in FIG. 4.

Referring to FIG. 5, logical sum of the data stored in response register 30 and the result of retrieval is provided by OR gate 35, and its output is transferred to flag bit column 12 in response to control signal $\phi$. An NOR gate may be used instead of the OR gate.

Figure 6:
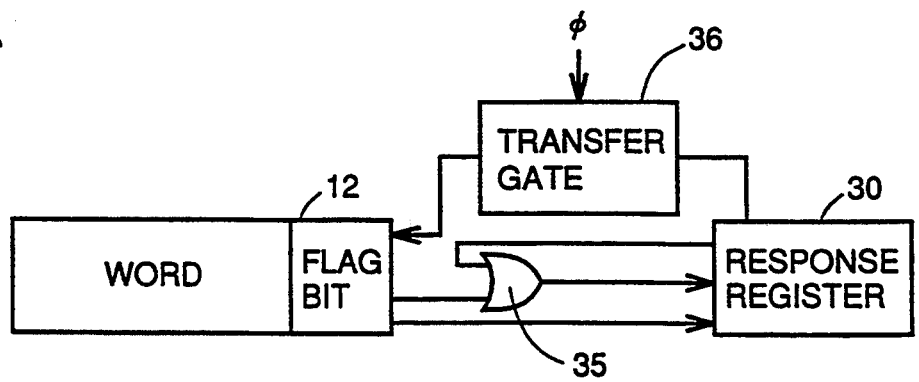
FIG. 6 shows an example in which a transfer gate is used in addition to the OR gate shown in FIG. 4.

Referring to FIG. 6, the result of retrieval is stored in response register 30, a logical sum of the data stored in response register 30 and the result of retrieval is provided by OR gate 35, and its output is stored in response register 30. The data stored in response register 30 is transferred by a transfer gate 36 to flag bit column 12 in response to the control signal $\phi$.

Figure 7:
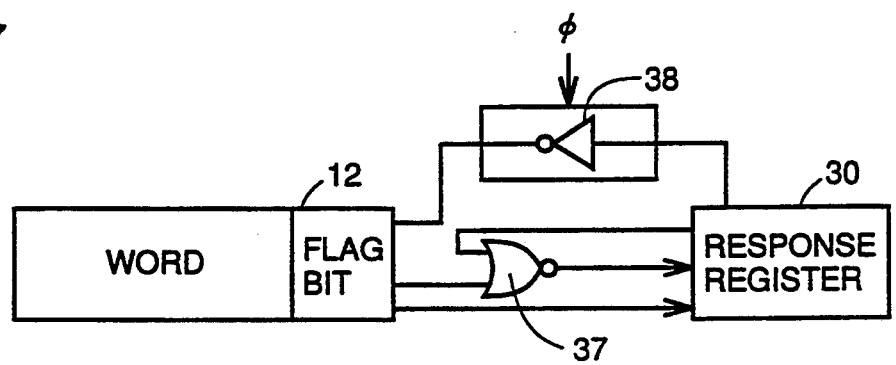
FIG. 7 shows an example in which an NOR gate and an inverter are used instead of the OR gate shown in FIG. 4.

In the example of FIG. 7, an NOR gate 37 is used instead of the OR gate 35, and an inverter 38 is provided in place of the transfer gate 36 of FIG. 6, and its operation is approximately the same.

Figure 8:
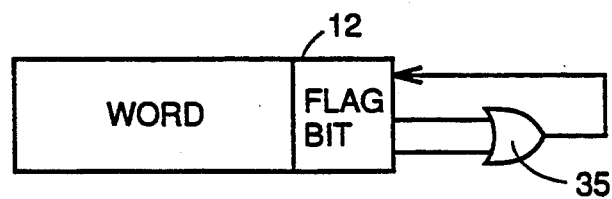
FIG. 8 shows an example in which the output from the OR gate shown in FIG. 4 is directly applied to the flag bit.

In the example shown in FIG. 8, the content of the flag bit column 12 and the result of retrieval are passed through OR gate 35 and directly transferred to the flag bit column 12.

Figure 9:
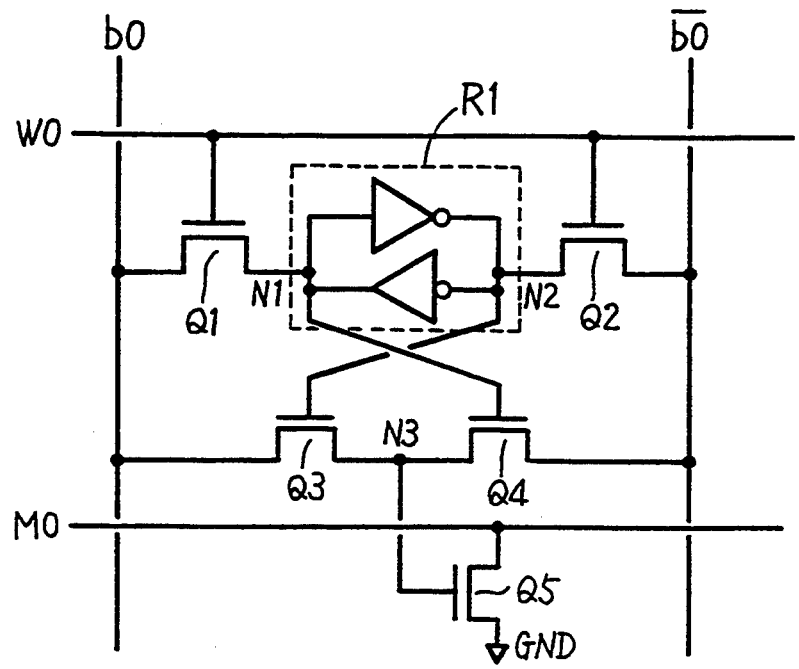
FIG. 9 is a schematic diagram showing a CAM cell used in one embodiment of the present invention.

FIG. 9 is a schematic diagram showing one example of the CAM cell constituting the memory cell array 2 shown in FIG. 1. The CAM cell shown in FIG. 9 has been conventionally used. This cell is connected to bit lines b0 and/b0, a word line W0, a match line M0 and the ground GND, respectively, and it includes a register R1 and N channel MOS transistors Q1 to Q5. Word line W0 is connected to the gates of N channel MOS transistors Q1 and Q2, bit line b0 is connected to the sources of N channel MOS transistors Q1 and Q3, and bit line/b0 is connected to sources of N channel MOS transistors Q2 and Q4. Register R1 holding the stored data has its node N1 connected to the drain of N channel MOS transistor Q1 and to the gate of N channel MOS transistor Q4, and its node N2 connected to the drain of N channel MOS transistor Q2 and to the gate of N channel MOS transistor Q3. The N channel MOS transistors Q3 and Q4 have their drains connected to the gate of N channel MOS transistor Q5, and N channel MOS transistor Q5 has its drain connected to match line M0 and its source connected to the ground GND.

Figure 10:
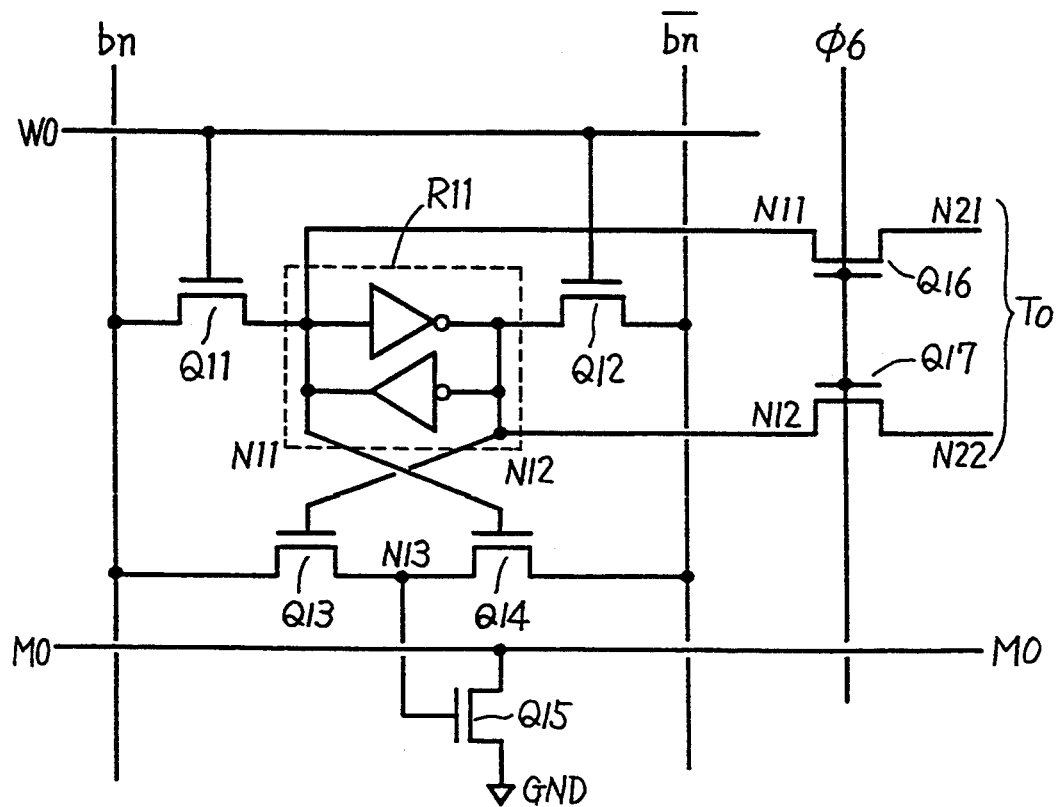
FIG. 10 is a schematic diagram showing a flag cell in the CAM used in one embodiment of the present invention.

FIG. 10 is a schematic diagram of electric circuitry showing an example of the flag cell constituting the flag bit column 12 shown in FIG. 1. The flag cell shown in FIG. 10 is based on the CAM cell of FIG. 9 and modified a little. Similar to the CAM cell shown in FIG. 9, the flag cell is connected to bit lines bn and/bn, a word line WL, a match line M0 and the ground GND respectively, and is further connected to nodes N21 and N22 of response register 30 having logic function. The flag cell includes a register R11 and N channel MOS transistors Q11 to Q17. Word line W0 is connected to the gates of N channel MOS transistors Q11 and Q12, bit line bn is connected to the sources of N channel MOS transistors Q11 and Q13 and bit line/bn is connected to the sources of N channel MOS transistors Q12 and Q14.

Register R11 holding the stored data has its node N11 connected to the drain of N channel MOS transistor Q11 and to the gate of N channel MOS transistor Q14, and its node N12 connected to the drain of N channel MOS transistor Q12 and to the gate of the N channel MOS transistor Q13. N channel MOS transistors Q13 and Q14 have their drains connected to the gate of N channel MOS transistor Q15, the N channel MOS transistor Q15 has its drain connected to match line M0 and its source connected to the ground GND. Further, a transfer control signal $\phi 6$ output from control circuit 50 of FIG. 1 is applied to the gates of N channel MOS transistors Q16 and Q17. Register R11 has its nodes N11 and N12 connected to the drains of N channel MOS transistors Q16 and 17, and response registers 30 having logic function has its nodes N21 and N22 connected to the sources of N channel MOS transistors Q16 and Q17, respectively.

Figure 11:
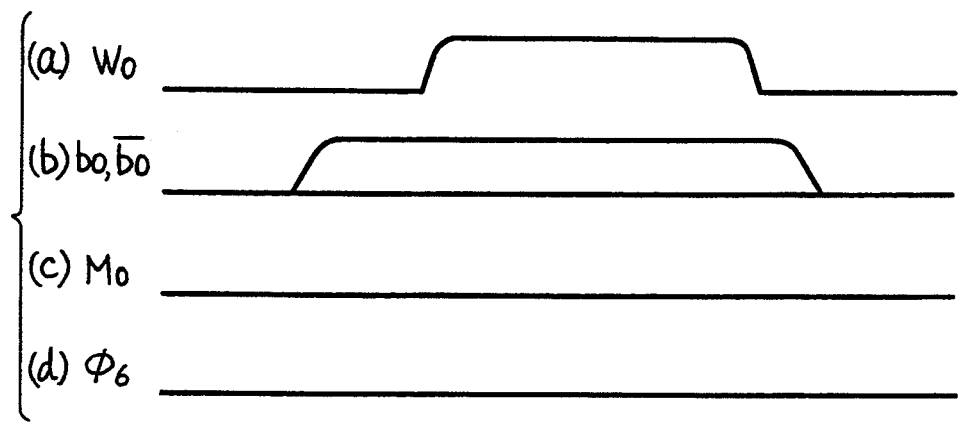
FIG. 11 is a timing chart showing the writing operation of the CAM cell and the flag cell of FIGS. 9 and 10.
Figure 12:
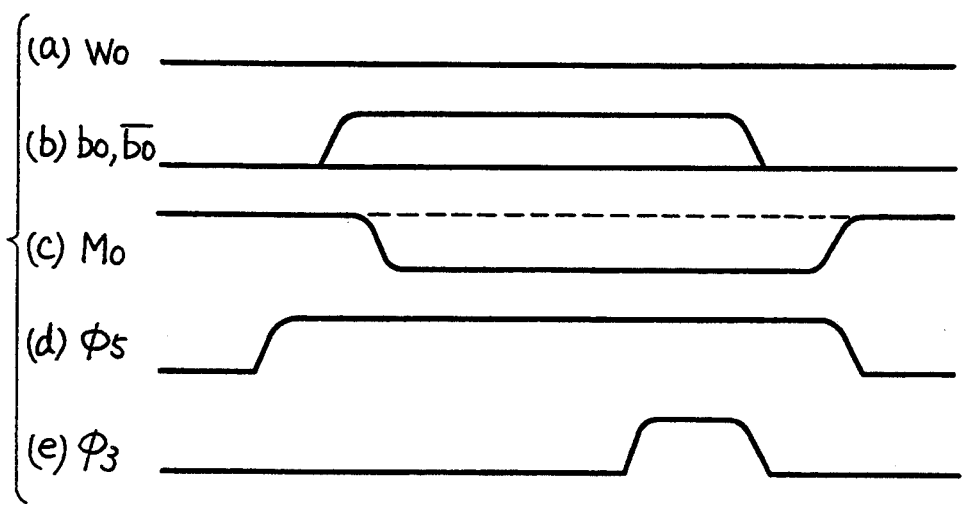
FIG. 12 is a timing chart showing the coincidence retrieval operation.

FIG. 11 is a timing chart showing the writing operation in the CAM cell and the flag cell shown in FIGS. 9 and 10, and FIG. 12 is a timing chart showing the coincidence retrieval operation.

The operation of the CAM cell shown in FIG. 9 will be described. Referring to FIG. 11 (a), in writing operation, when word line W0 is set to "H" level, N channel MOS transistors Q1 and Q2 turn on, data is applied to bit lines b0 and/b0 as shown in FIG. 11 (b) and the content of register R1 is re-written. At this time, match line M0 holds the "L" level as shown in FIG. 11 (c).

In reading operation, bit lines b0 and /b0 are precharged to an appropriate potential, word line W0 is set to "H" level, N channel MOS transistors Q1 and Q2 turn on, and data of register R1 is read to the bit line pair.

As for the coincidence retrieval operation, assume that "1" has been stored in register R1 (that is, the node N1 is at "H" level and the node N2 is at "L" level), word line WL as well as bit lines b0 and /b0 are at "L" as shown in FIGS. 12 (a) and (b), and that the match line M0 has been precharged to an appropriate potential as shown in FIG. 12 (c). At this time, N channel MOS transistor Q3 is off, N channel MOS transistor Q4 is on, node N3 is at "L" level, and N channel MOS transistor Q5 is off.

When the data stored in register R1 coincides with the data applied to the bit line pair, that is, when "1" is applied to the bit line pair (that is, "H" level to b0 and "L" level is applied to /b0), node N3 attains "L" level, N channel MOS transistor Q5 is kept off, and match line M0 maintains the precharge level as shown by the dotted line of FIG. 12 (c).

When the data stored in register R1 does not coincide with the data applied to the bit line pair, that is, when "0" is applied to the bit line pair ("L" level to b0 and "H" level to /b0), node N3 attains to "H" level, N channel MOS transistor Q5 turns on, and as shown by the solid line of FIG. 12 (c), the match line M0 is drawn to "L" (GND) level. Coincidence/non-coincidence is determined dependent on the potential level of match line M0.

The operation of the flag cell shown in FIG. 10 will be described. The writing, reading and coincidence retrieval operations are the same as those of the circuit shown in FIG. 9. In this flag cell, the content of response register 30 having logic function can be transferred to register R11. The content of response register 30 having logic function appears at nodes N21 and N22, and the content can be transferred to nodes N11 and N12 of register R11 by setting the transfer control signal φ6 at "H" level.

Figure 13:
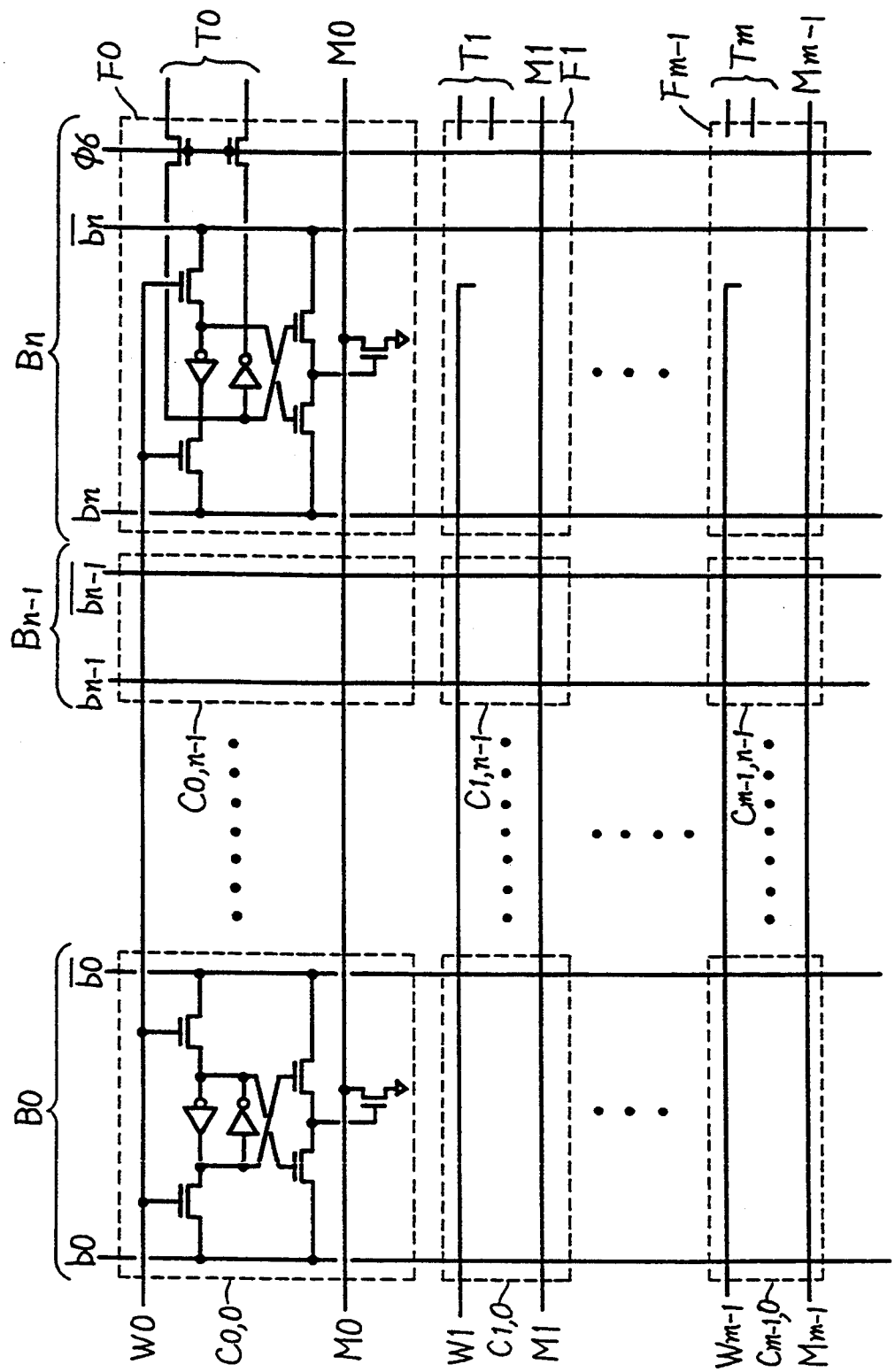
FIG. 13 is a schematic diagram showing the CAM cell array and the flag bit column in accordance with one embodiment of the present invention.

FIG. 13 is a schematic diagram showing the memory array 2 and the flag bit column 12 of FIG. 1. CAM cells C0, 0 to Cm−1, n−1 correspond to the cells of FIG. 9, and flag cells F0 to Fn−1 correspond to the cells of FIG. 10. Referring to FIG. 13, word lines W0 to Wm−1 and match lines M0 to Mm−1 are commonly used for the CAM cells and the flag cells. Bit lines b0 and /b0 to bn and /bn have structures common to the CAM cells and the flag cells. Therefore, writing, reading and coincidence retrieval operation (including garbage collection) are the same in the CAM cells and the flag cells, and therefore these operations can be effected simultaneously. Flag cells F0 to Fm−1 are connected to transfer line pairs T0 to Tm−1 connected to response register 30 having logic function through N channel MOS transistors having the transfer control signal φ6 applied to their gates.

Figure 14:
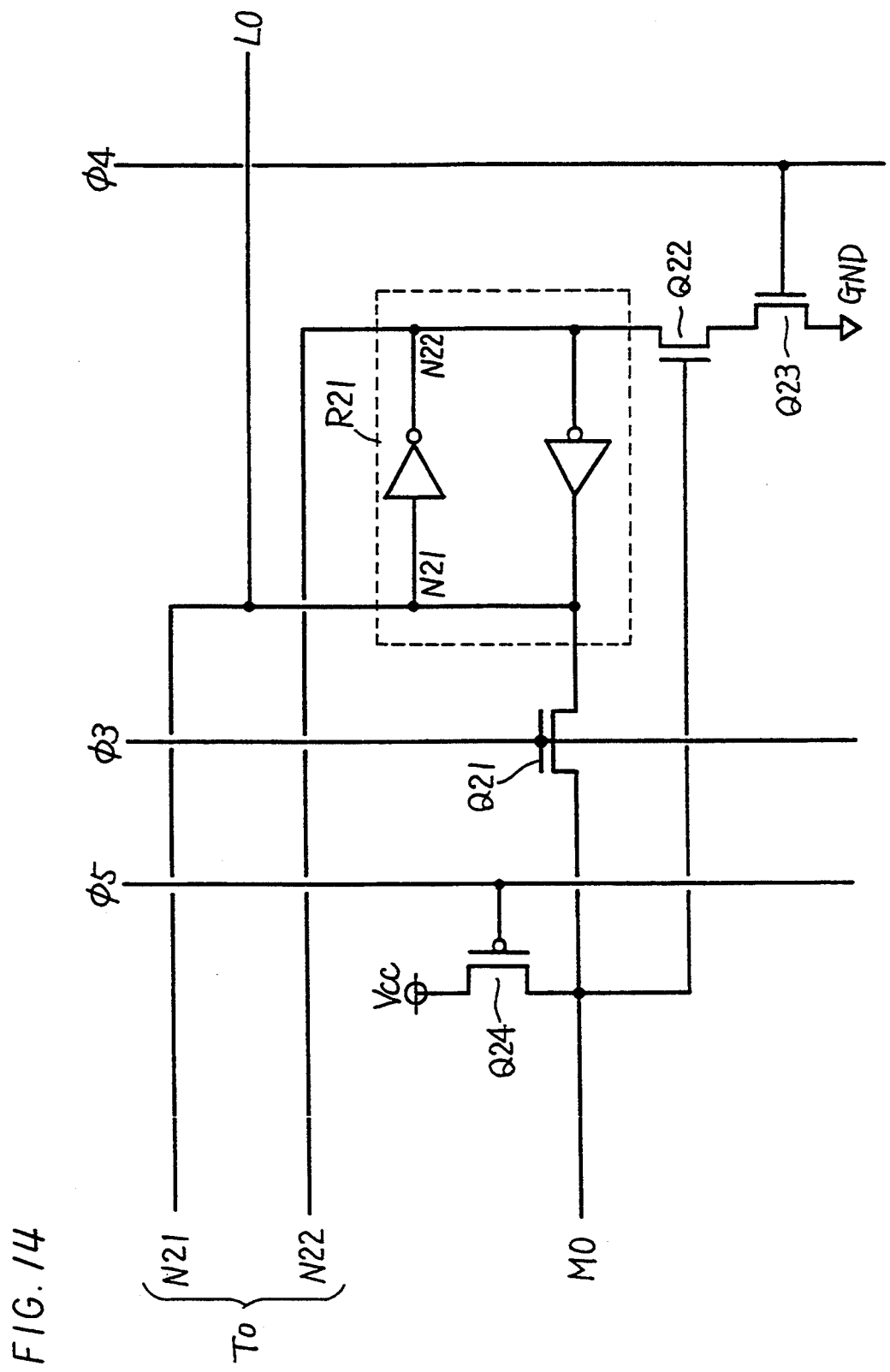
FIG. 14 is a schematic diagram showing the response register having logic function in the CAM in accordance with one embodiment of the present invention.

FIG. 14 shows an example of a response register of 1 bit group constituting the response register 30 having logic function. The response register shown in FIG. 14 includes a register R21, N channel MOS transistors Q21 to Q23 and a P channel MOS transistor Q24, and it is connected to match line M0, transfer line pair T0, a result output line L0, control signal lines φ3 to φ5, a supply voltage Vcc and the ground potential GND. Match line M0 is connected to node N21 of register R21 through N channel MOS transistor 21 having its gate connected to control signal line φ3, transfer line pair T0 is connected to nodes N21 and N22 of register R21, result output line L0 is connected to node N21 of register R21, and the node N22 of register R21 is connected to the ground potential GND through N channel MOS transistor Q22 having its gate connected to the match line M0 and through N channel MOS transistor Q23 having its gate connected to control signal line φ4.

The operation of the response register for 1 bit group constituting the response register 30 having logic function shown in FIG. 14 will be described. First, an operation of transferring data of match line M0 to register R21 will be described. First, by setting control signal φ5 to "L" level, P channel MOS transistor Q24 turns on, match line M0 is precharged to "H" level, and P channel MOS transistor Q24 is again turned off. If the result of coincidence retrieval operation indicates coincidence, match line M0 attains to "H", and when the result indicates non-coincidence, match line M0 attains to "L". By raising control signal φ3 to "H" level, N channel MOS transistor Q21 turns on, and information of match line M0 is written to the node N21 of register 21. General transfer is carried out in this manner.

Figure 15:
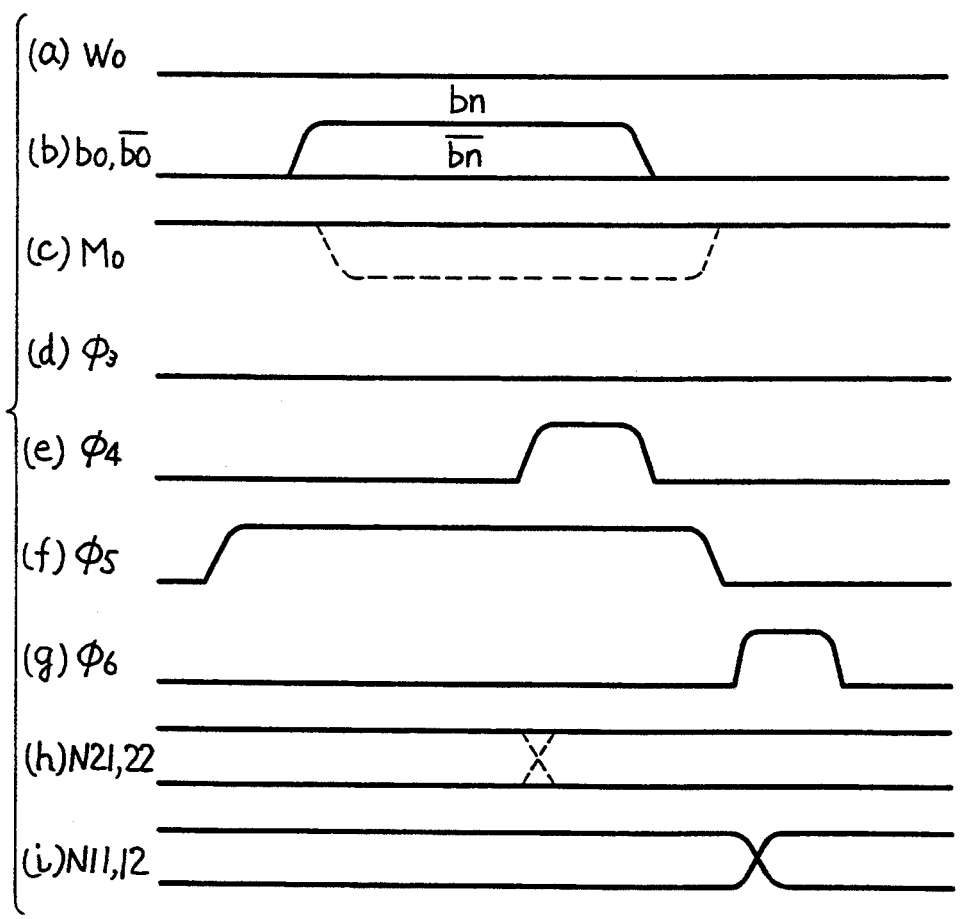
FIG. 15 is a timing chart showing an operation of collective disabling of the coincident words.

FIG. 15 is a timing chart showing an operation of transferring coincident words collectively to the flag bit column. Referring to FIG. 15, an operation in which the result of OR operation between the data on match line M0 and the data of register R21 shown in FIG. 14 is transferred to register R21 again and then applied to flag bit column 12 will be described. When coincidence is detected as a result of coincidence retrieving operation or garbage collection, match line M0 attains to the "H" level as indicated by the solid line of FIG. 15 (c), and when non-coincidence is indicated, match line M0 attains to "L" level as shown by the dotted line of FIG. 15 (c). Therefore, N channel MOS transistor Q22 may be on or off correspondingly. By raising control signal φ4 to "H" level as shown in FIG. 15 (e), N channel MOS transistor Q23 turns on. At this time, when match line M0 is at "H" level, the node N22 of register R21 attains to the ground potential GND through N channel MOS transistors Q22 and Q23. More specifically, when coincidence is determined, register R21 attains to "1" (node N21 is at "H" level and node N22 is at "L" level as shown in FIG. 15 (h)), regardless of the original value of register R21.

Meanwhile, if match line M0 is at "L" level, that is, at the time of non-coincidence, N channel MOS transistor Q22 turns off, and therefore even when control signal φ4 rises to "H" and N channel MOS transistor Q23 turns on, register R21 maintains the original value. When control signal φ6 is raised to "H" level as shown in FIG. 15 (g), the N channel MOS transistors Q16 and Q17 shown in FIG. 10 turn on, potentials at nodes N21 and N22 shown in FIG. 15 (h) are transmitted to nodes N11 and N12 as shown in FIG. 15 (i), and thus transfer to the bit flag column 12 is completed.

Figure 16:
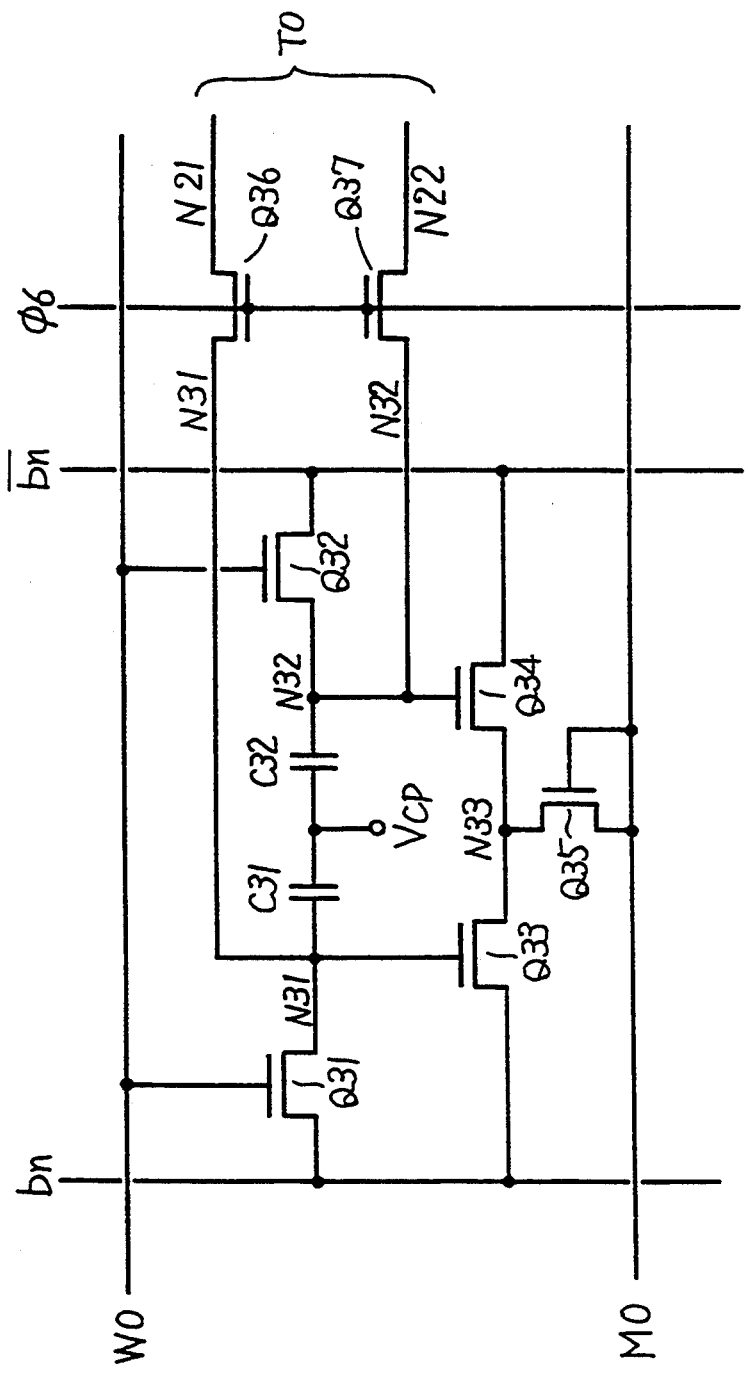
FIG. 16 is a schematic diagram showing a flag cell in accordance with another embodiment of the present invention.

FIG. 16 is a schematic diagram showing another embodiment of the flag cell. The flag cell of FIG. 16 is connected to bit lines bn and /bn, a word line W0, a match line M0 and a fixed potential Vcp as well as two nodes N21 and N22 of response register 30 having logic function. It receives a transfer control signal φ6 output from control circuit 50. The flag cell includes capacitors C31 and C32 and N channel MOS transistors Q31 to Q37. Word line W0 is connected to the gates of N channel MOS transistor Q31 and Q32, bit line bn is connected to sources of N channel MOS transistors Q31 and Q33, and bit line /bn is connected to sources of N channel MOS transistors Q32 and Q34. Capacitor C31 holding stored data has its node N31 connected to the drain of N channel MOS transistor Q31 and to the gate of N channel MOS transistor Q33, while capacitor C32 has its node N32 connected to the drain of N channel MOS transistor Q32 and to the gate of N channel MOS transistor Q34.

N channel MOS transistors Q33 and Q34 have their drains connected to the source of N channel MOS transistor Q35, and N channel MOS transistor Q35 has its drain and the gate connected to match line M0. Further, transfer control signal $\phi 6$ is applied to the gates of N channel MOS transistors Q36 and Q37. Capacitor C31 has its node N31 connected to the drain of N channel MOS transistor Q36, capacitor C32 has its node N32 connected to the drain of N channel MOS transistor Q37, and response register 30 having logic function has its nodes N21 and N22 connected to the sources of N channel MOS transistors Q36 and Q37, respectively.

The operation of the flag cell shown in FIG. 16 will be described. Writing operation is effected in the following manner. Namely, word line W0 is set to "H" level to turn on N channel MOS transistors Q31 and Q32, data is applied to bit lines bn and /bn and data (stored charges) are held in capacitors C31 and C32. Reading operation is carried out in the following manner. Bit lines bn and /bn are precharged to an appropriate potential to be at a floating state, word line W0 is set to "H" so that N channel MOS transistors Q31 and Q32 turn on, and data (stored charges) of capacitors C31 and C32 are read to bit line pair bn and/bn.

As for the coincidence retrieval operation, assume that "1" is stored in the flag cell ("H" level at node N31 and "L" level at node N32), bit lines bn and /bn are both at "H" level and match line M0 has been precharged to an appropriate potential. At this time, N channel MOS transistor Q33 turns on, and N channel MOS transistor Q34 turns off. Node N33 is at "H" level and N channel MOS transistor Q35 is off. If the data stored in the flag cell coincides with the data applied to the bit line pair, that is, when "1" is applied to the bit line pair ("H" level to bn and "L" level to /bn), node N33 attains to "H" level, N channel MOS transistor Q35 is kept off and match line M0 is maintained at the precharge level.

When the data stored in the flag cell does not coincide with the data applied to the bit line pair, that is, when "0" is applied to the bit line pair ("L" level to bn and "H" level to/bn), node N33 attains to "L" level, N channel MOS transistor Q35 turns on and match line M0 attains to the "L" level through N channel MOS transistors Q35 and Q34 and bit line /bn. Coincidence/non-coincidence is determined dependent on the potential level of match line M0. The transfer operation from response register 30 having logic function is carried out in the following manner. Namely, the content of response registers 30 having logic function appears on nodes N21 and N22. When control transfer signal $\phi 6$ is set to "H" level, the content is transferred to nodes N31 and N32 of the flag cell, and the transferred data is held in capacitors C31 and C32.

Figure 17:
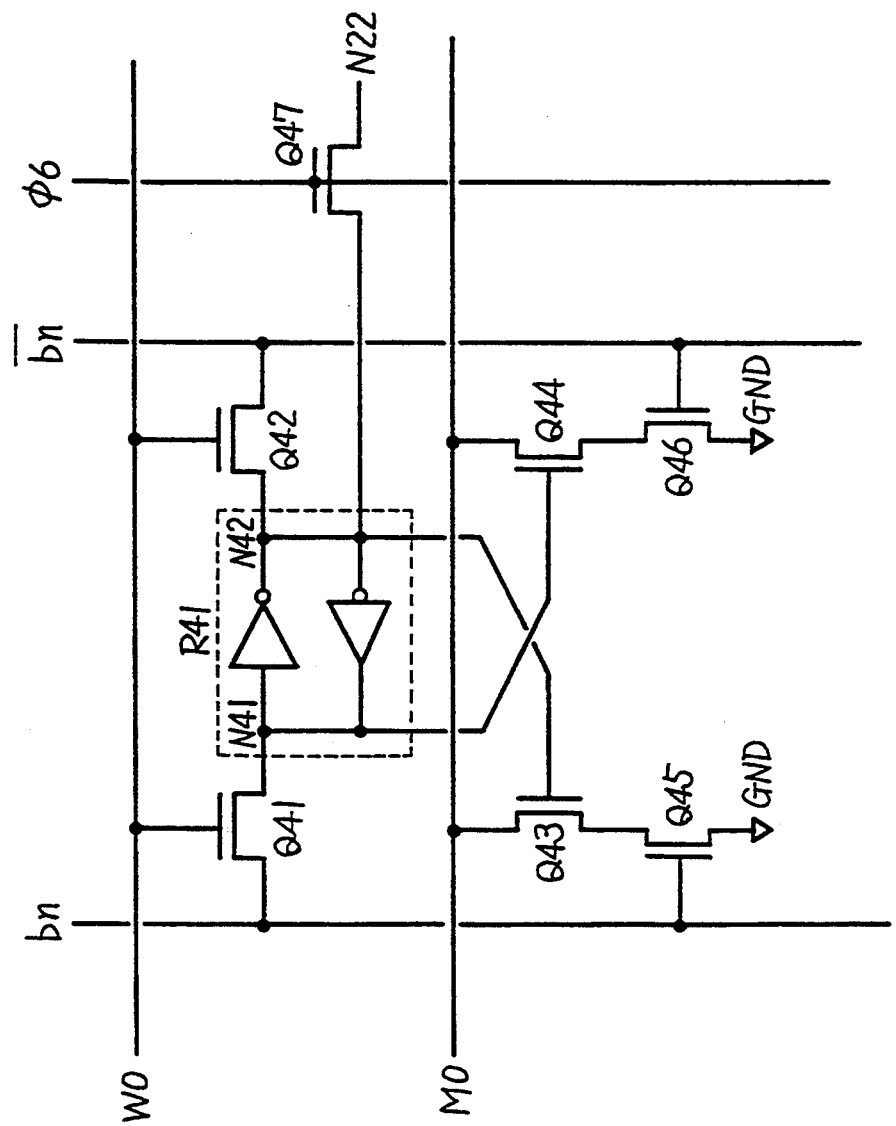
FIG. 17 is a schematic diagram showing a flag cell in accordance with a further embodiment of the present invention.

FIG. 17 shows a further embodiment of the flag cell. The flag cell of FIG. 17 is connected to bit lines bn and /bn, word line W0, match line M0 and the ground potential GND, respectively, as well to a node N22 of response register 30 having logic function. Transfer control signal $\phi 6$ is applied thereto. The flag cell includes a register R41 and N channel MOS transistors Q41 to Q47. Word line W0 is connected to the gates of N channel MOS transistors Q41 and Q42, bit line bn is connected to the source of N channel MOS transistor Q41 and to the gate of N channel MOS transistor Q45, and bit line /bn is connected to the source of N channel MOS transistor Q42 and to the gate of N channel MOS transistor Q46.

Register R41 holding the stored data has its node N41 connected to the drain of N channel MOS transistor Q41 and to the gate of N channel MOS transistor Q44, and its node N42 connected to the drain of N channel MOS transistor Q42 and to the gate of N channel MOS transistor Q43. Transfer control signal $\phi 6$ is applied to the gate of N channel MOS transistor Q47. Register R41 has its node N42 connected to the drain of N channel MOS transistor Q47, and response register 30 having logic function has its node N22 connected to the source of N channel MOS transistor Q47. Writing operation, coincidence retrieval operation and the transfer operation for the flag cell are approximately the same as those of the flag cell shown in FIGS. 10 and 16, and therefore description thereof is not repeated.

Figure 18:
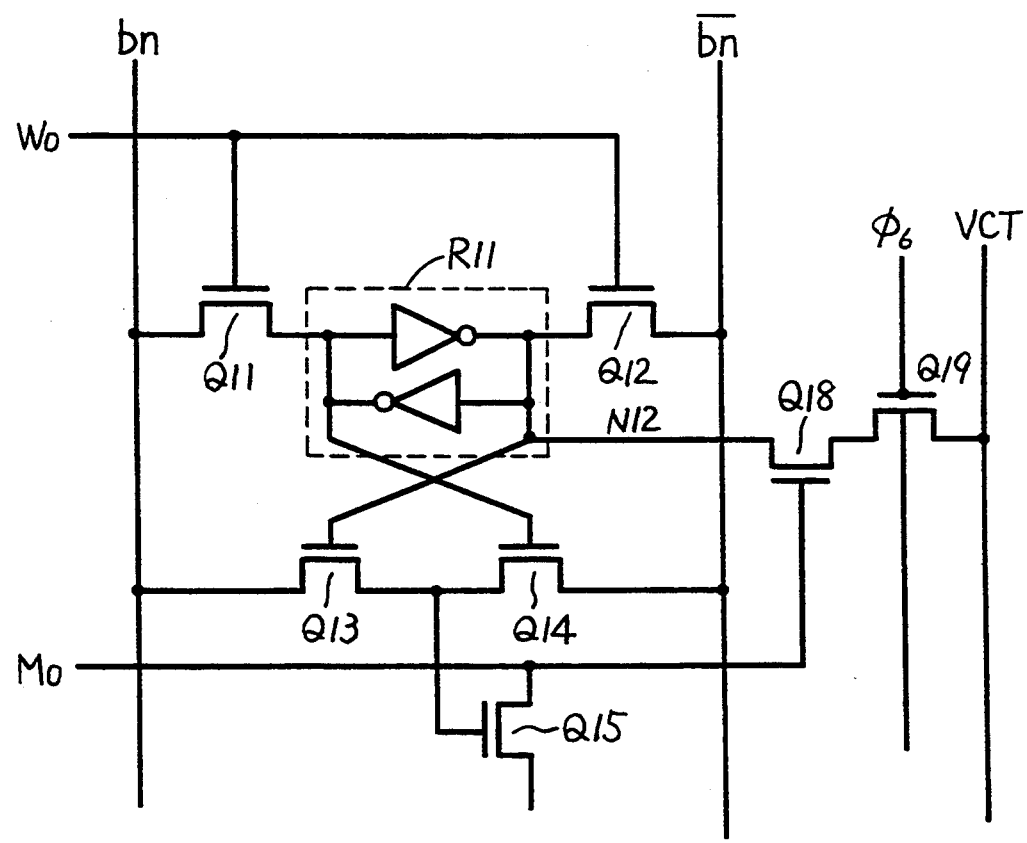
FIG. 18 is a schematic diagram showing a flag cell in accordance with a still further embodiment of the present invention.

FIG. 18 is a schematic diagram showing a still further embodiment of the flag cell. In this embodiment shown in FIG. 18, N channel MOS transistors Q18 and 19 are provided in place of N channel MOS transistors Q16 and Q17 of the embodiment shown in FIG. 10. More specifically, the N channel MOS transistor Q18 has its drain connected to node N12 and its gate connected to match line M0. N channel MOS transistor Q18 has its source connected to the drain of N channel MOS transistor Q19. The control signal $\phi 6$ is applied to the gate of N channel MOS transistor Q19. Control signal VCT is applied to the source of N channel MOS transistor Q19. Except these points, the structure is the same as that of FIG. 10.

The operation of the flag cell shown in FIG. 18 will be described. As for the flag bit, when match line M0 is at "H" level (indicating coincidence), control signal VCT is fixed at "L" level, the control signal $\phi 6$ is activated to "H" level, so that node N11 attains to "L" level, node N12 attains to "H" level, and therefore "1" can be set at the flag bit of the coincident word (disabled).

In case of non-coincidence, match line M0 is at "L". Therefore, even when the control signal $\phi 6$ is activated to "H" to turn on the N channel MOS transistor Q19, N channel MOS transistor Q18 remains off, and therefore data of the flag bit is not changed. Namely, the flag cell also has the OR function. Therefore, words subjected to the new retrieval operation can be added to the unnecessary words.

When the value of control signal VCT is fixed at "H" level, the unnecessary words indicating coincidence (words which do not participate in retrieval in normal retrieval) can be newly set as necessary words (words which participate in retrieval).

Figure 19:
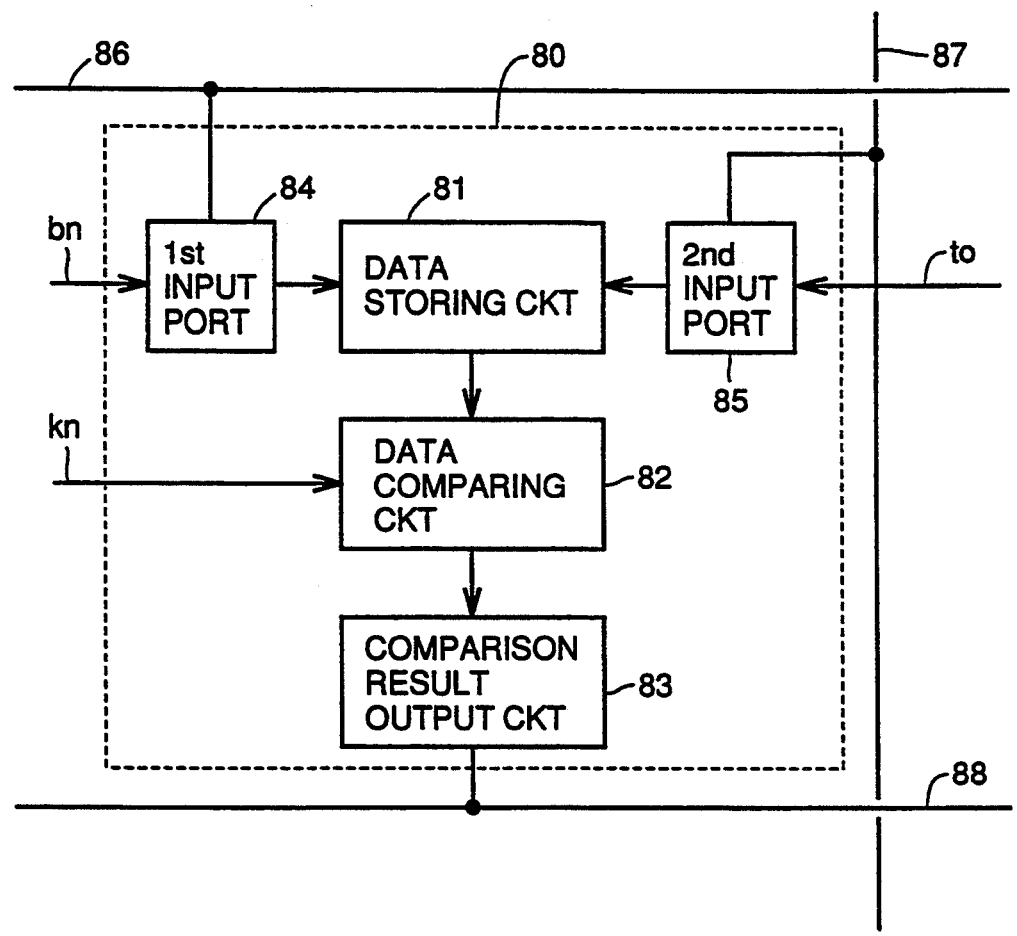
FIG. 19 is a block diagram showing a flag cell in accordance with a still another embodiment of the present invention.

FIG. 19 shows a much generalized embodiment of the flag cell. Referring to FIG. 19, the flag cell 80 includes a data storing circuit 81, a data comparing circuit 82, a comparison result output circuit 83, a first input port 84 and a second input port 85, and it is connected to a word line 86 and a match line 88 arranged parallel to each other and to a transfer control line 87 intersecting orthogonally therewith. A first input data (or input/output data) bn and a second input data t0 and a coincidence retrieval data kn are input to the flag cell. The first input data bn is input to data storing circuit 81 through first input port 84 and first input port 84 is connected to word line 86. Second input data t0 is input to data storing circuit 81 through second input port 85, and second input port 85 is connected to transfer control line 87. The data stored in data storing circuit 81 and coincidence retrieval data kn are input to data comparing circuit 82, and the result of comparison is input to comparison result output circuit 83. Comparison result output circuit 83 is connected to match line 88.

Referring to FIG. 19, writing operation of the first input data bn to the flag cell 80 will be described. First input data bn is applied to flag cell 80, then word line 86 is controlled so that the first input port 84 is opened, data is input to data storing circuit 81, the word line 86 is controlled again, and first input port 84 is closed. Thus writing operation is completed.

The coincidence retrieval operation in the flag cell 80 will be described. When coincidence retrieval data kn is input to flag cell 80, the coincidence retrieval data kn is compared with the data stored in data storing circuit 81 in data comparing circuit 82, and the result is output through comparison result output circuit 83 to match line 88. Thus coincidence retrieval operation is completed. These operations are general operations in the conventional CAM cell.

The feature of the flag cell 80 shown in FIG. 19 is that it includes a second input port 85 controlled by transfer control line 87 which orthogonally intersects with word line 86 and match line 88, so that writing operation of second input data t0 to flag cell 80 (hereinafter referred to as transfer operation) is possible. This transfer operation will be described. The second input data t0 is applied to flag cell 80, then transfer control line 87 is controlled so that the second input port 85 is opened, data is transferred to data storing circuit 81, transfer control line 87 is again controlled and the second input port 85 is closed. Thus transfer operation is completed.

Figure 20:
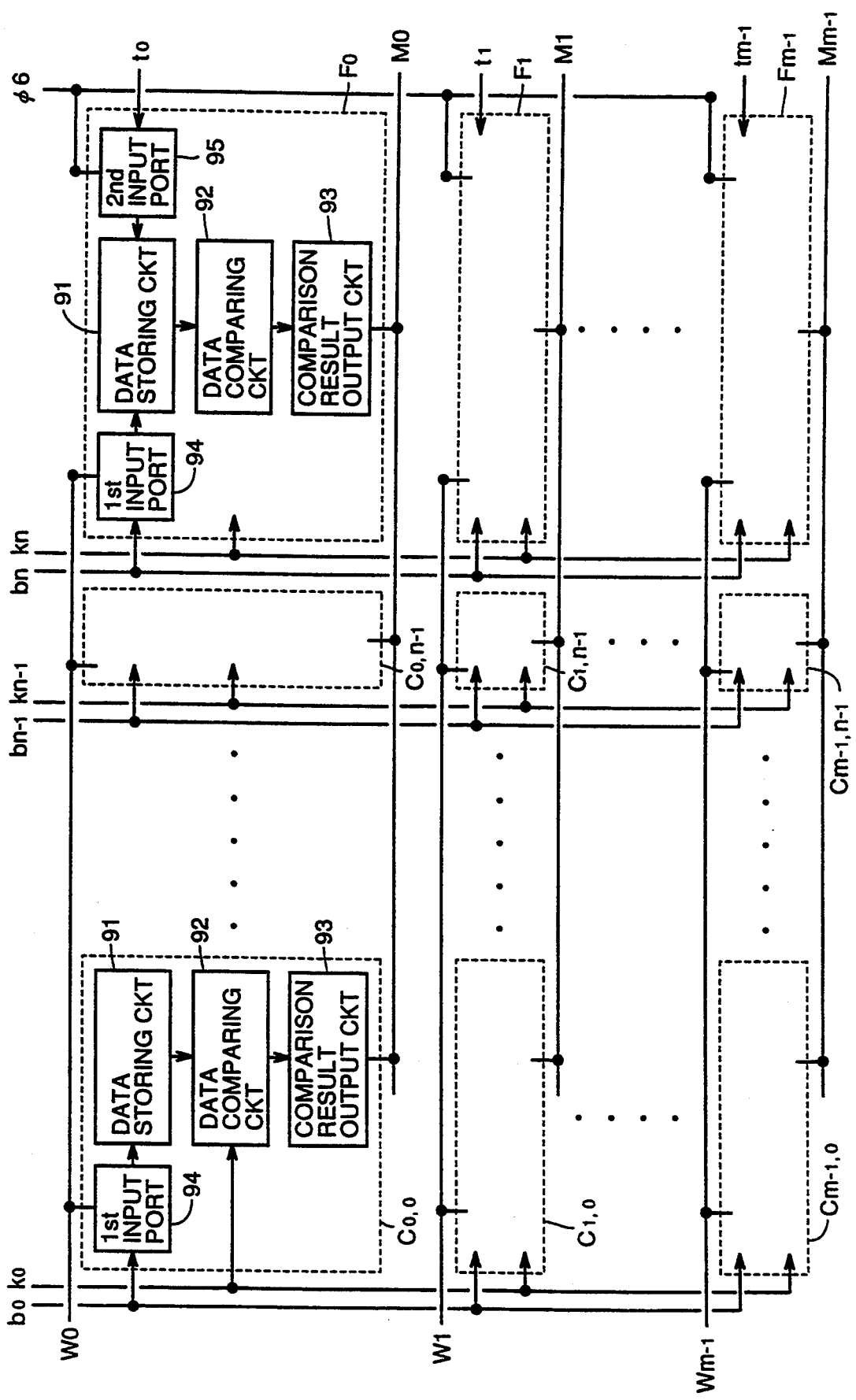
FIG. 20 is a schematic diagram showing the CAM cell array and the flag bit column in accordance with another embodiment of the present invention.
Figure 21:
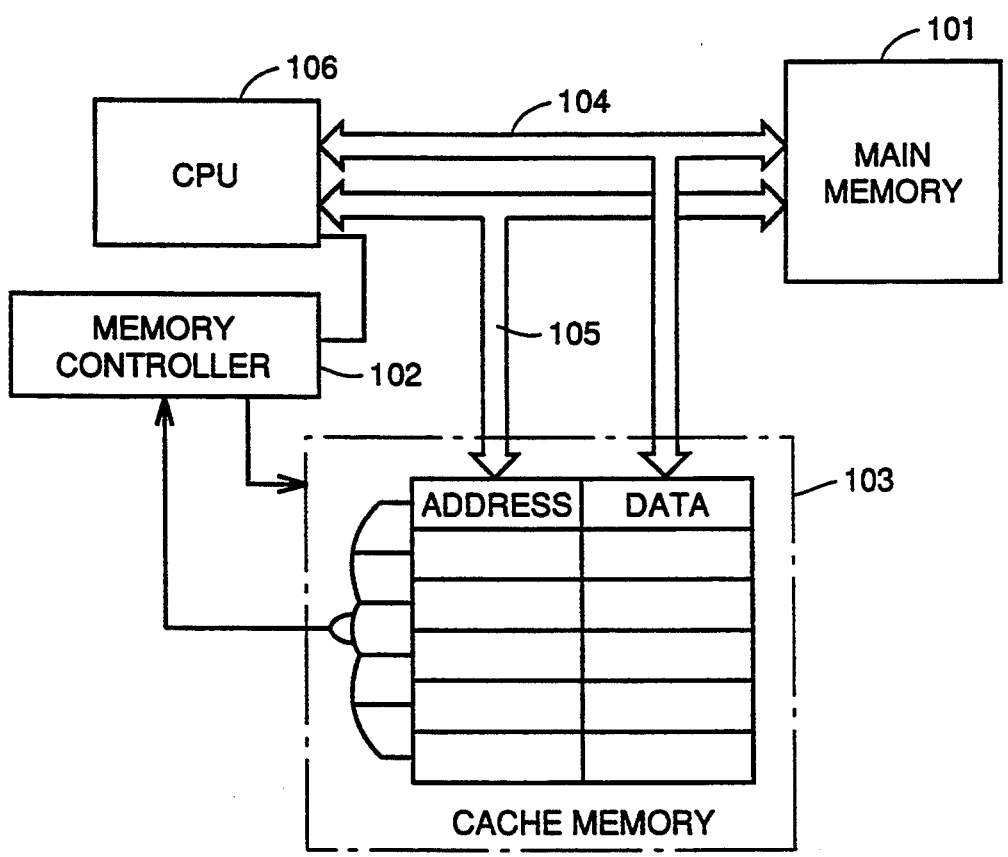
FIG. 21 is a block diagram of a conventional system for accessing a cache memory.

FIG. 20 shows an embodiment which is further generalized from FIG. 13. It shows memory cell array 2 and flag bit column 12 of FIG. 1. Referring to FIG. 20, memory cell array 2 includes CAM cells C0, 0 to Cm−1, n−1, while flag bit column 12 includes flag cells F0 to Fm−1. Word lines W0 to Wm−1 and match lines M0 to Mm−1 are commonly connected to CAM cells C0, 0 to Cm−1, n−1 and flag cells F0 to Fm−1. Write data lines (corresponding to the bit lines or first input data line) b0 to bn and coincidence retrieval data k0 to kn are also common to CAM cells C0, 0 to Cm−1, n−1 and flag cells F0 to Fm−1. Therefore, writing, reading and coincidence retrieval operations (including garbage collection) can be carried out in the similar manner both in CAM cells C0, 0 to Cm−1, n−1 and flag cells F0 to Fm−1. Further, transfer lines T0 to Tm−1 connected to response register 30 having logic function are connected to flag cells F0 to Fm−1.

Flag cells F0 to Fm−1 of FIG. 20 are the same as the flag cell 80 of FIG. 19 described above, and it includes a data storing circuit 91, a data comparing circuit 92, a comparison result output circuit 93, a first input port (or an input/output port) 94 and a second input port 95. It is connected to word lines W0 to Wm−1 and match lines M0 to Mm−1 arranged parallel to each other and to a transfer control line $\phi 6$ orthogonally intersecting therewith, and the manner of connection is the same as that of FIG. 19.

CAM cells C0, 0 to Cm−1, n−1 of FIG. 20 includes data storing circuit 91, data comparing circuit 92, comparison result output circuit 93 and a first input port (or an input/output port) 94, and connected to word lines W0 to Wm−1 and match lines M0 to Mm−1. Note a CAM cell C0, 0 for example, write data (or input/output data) b0 and coincidence retrieval data k0 are input to this cell. Write data b0 is input to data storing circuit 91 through first input port 94, and first input port 94 is connected to word line W0. Data stored in data storing circuit 91 and coincidence retrieval data k0 are input to data comparing circuit 92, and the result of comparison is input to comparison result output circuit 93. The comparison result output circuit 93 is connected to match line M0.

As described above, the flag cell in accordance with this embodiment is arranged adjacent to CAM cell array which is arranged as two dimensional array, and connected to common word lines W0 to Wm−1 and common match lines M0 to Mm−1. In the flag cell, data storing circuit 91, data comparing circuit 92, comparison result output circuit 93 and the first input port 94 have the same structures as those of the CAM cell. Therefore, writing, reading, coincidence retrieval and garbage collection (retrieval of unnecessary words) operations for the flag cell can be carried out simultaneously through the same procedure as the CAM cell. Further, a port for receiving information of retrieval results of the word is provided for the flag cell, and therefore a plurality of words can be disabled in parallel simultaneously.

Further, since the response register which holds the result of coincidence retrieval and garbage collection operation word by word has a function of logic operation between held data and new result of retrieval, it becomes possible to carry out garbage collection, hold the result thereof as unnecessary word data, carry out coincidence retrieval operation, retrieve words which are to be newly disabled, provide an OR thereof, and to hold all unnecessary words in the response register. By transferring the held data in parallel to the flag cell in the above described manner, a plurality of words can be newly disabled simultaneously, in addition to the words which have been unnecessary.

Further, since a new input port is provided for the aforementioned flag cell, the flag cell can be used as a temporary register, and the function of operation incidental to each word of the CAM can be more effectively used.

As described above, according to this embodiment, data based on the result of comparison output to the match line are written to flag cell, data stored in the flag cell are written to a predetermined one column in parallel for every row of the memory cells, and thus a plurality of coincident words can be disabled collectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A content addressable memory device carrying out retrieval operation based on an applied retrieval data for designating a specific word, comprising:

data storing means including memory cells of a plurality of rows and a plurality of columns;

comparing means for comparing data stored in each memory cell of said data storing means and said retrieval data to detect a coincidence; and re-writing means responsive to a comparison output from said comparing means for re-writing in parallel content of a specific memory cell of respective row of said data storing means.

2. A content addressable memory device carrying out a retrieval operation based on an applied retrieval data for designating a specific word, comprising:

a plurality of rows of data storing means for storing data;

flag information storing means provided corresponding to each row of said data storing means for storing flag information;

flag information comparing means for comparing an externally applied flag information and each flag information of said flag information storing means to detect coincidence thereof; and re-writing means responsive to a result of said retrieval and/or a result of said flag information comparing means for re-writing in parallel the flag information stored in said flag information storing means, wherein said flag information storing means sets flag bits in advance at rows which are subjected to previous retrievals; and said flag information comparing means includes means for comparing said externally applied flag information and the flag bit stored in said flag information storing means.

3. The content addressable memory device according to claim 2, wherein said re-writing means includes means for re-writing the flag bit of the flag information storing means of that row which is determined to be coincident by said flag information comparing means.

4. The content addressable memory device according to claim 2, wherein said re-writing means includes means for writing a flag bit in a row which is determined to be non-coincident by said flag information storing means.

5. A content addressable memory device carrying out a retrieval operation based on retrieval data including data and flag information for designating a specific word, comprising:

data storing means including memory cells arranged in a plurality of rows and columns and a flag cell corresponding to each of the rows for storing flag information, the memory cells and the flag cell of the same row constituting one word;

comparing means provided corresponding to each of the memory cells and each of the flag cells of said data storing means for comparing data of said retrieval data and the data of said memory cell and for comparing the flag information of said retrieval data and a flag of said flag cell;

a match line provided corresponding to each row of said data storing means for outputting a result of comparison by said comparing means;

logic operation means provided corresponding to each row of said data storing means, receiving the output from said match line for carrying out a logic operation; and writing means for writing an output from said logic operation means to the flag cell of said data storing means.

6. The content addressable memory device according to claim 5, wherein said logic operation means includes inverting means for inverting an output signal from said match line to apply the same to said writing means.

7. The content addressable memory device according to claim 5, wherein said logic operation means includes transfer means for transferring the output from said match line as it is to said writing means.

8. The content addressable memory device according to claim 5, wherein said logic operation means includes register means for storing means information output from the match line of each row, and a logical sum means for providing a logical sum of the information stored in said register means and the flag information stored in the flag cell of said data storing means for providing an output to said writing means.

9. The content addressable memory device according to claim 5, further comprising:

a word line provided corresponding to said each row;

first and second data lines, and a transfer control line orthogonally intersecting said word line and said match line;

first means responsive to activation of said word line for writing data applied from said first data line to said memory cells; and second means responsive to activation of said transfer control line for writing data applied from said second data line to said flag cell.

10. The content addressable memory device according to claim 9, further comprising third and fourth data lines orthogonally intersecting said each word line; wherein said comparing means includes first comparing means for comparing a retrieval data applied through said third data line and the data of said memory cell, and second comparing means for comparing the flag information applied through said fourth data line and the flag information of said flag cell.

11. A content addressable memory device used for retrieval, comprising:

retrieval data generating means for generating a retrieval data including data of a plurality of bits and flag information;

data storing means including memory cells arranged in a plurality of rows and columns and a flag cell corresponding to each row for storing flag information, the memory cells and the flag cell of the same row constituting one word;

comparing means provided corresponding to each of the memory cells and each of the flag cells of said data storing means for comparing data generated from said retrieval data generating means and the data of said memory cell and for comparing the flag information generated from said retrieval data generating means and the flag information of said flag cell;

a match line provided corresponding to each row of said data storing means for outputting a result of comparison from said comparing means;

logical operation means provided corresponding to each row of said data storing means, receiving the output from said match line for effecting a logical operation; and writing means for writing an output from said logical operation means to the flag cell of said data storing means.

12. In a content addressable memory device including data storing means including memory cells arranged in a plurality of rows and columns and a flag cell corresponding to each row for storing flag information, the memory cells and the flag cell of the same row constituting one word, applying a retrieval data to said memory cells and said flag cells for outputting a coincidence signal dependent on the result of retrieval, a method of disabling a coincident word, comprising the first step of holding flag information indicative of coincidence for a word of the memory cell in which the data is coincident, dependent on said result of retrieval, and the second step of re-writing a content of the flat cell of said word indicating coincidence, said second step includes the step of inverting the flag information held in said first step to write the inverted information to said flag cell.

13. In a content addressable memory device including data storing means including memory cells arranged in a plurality of rows and columns and a flag cell corresponding to each row for storing flag information, the memory cells and the flag cell of the same row constituting one word, applying a retrieval data to said memory cells and said flag cells for outputting a coincidence signal dependent on the result of retrieval, a method of disabling a coincident word, comprising the first step of holding flag information indicative of coincidence for a word of the memory cell in which the data is coincident, dependent on said result of retrieval, and the second step of re-writing a content of the flat cell of said word indicating coincidence, wherein said second step includes the step of effecting logical operation between the flag information held in said first step and the flag information stored in said flag cell for writing the result to said flag cell.

* * * * *